(12) United States Patent
Tu et al.

(10) Patent No.: US 10,082,905 B2
(45) Date of Patent: Sep. 25, 2018

(54) TOUCH CONTROL DISPLAY PANEL AND TOUCH CONTROL DISPLAY DEVICE

(71) Applicants: Xiamen Tianma Micro-Electronics Co., Ltd., Xiamen (CN); Tianma Micro-Electronics Co., Ltd., Shenzhen (CN)

(72) Inventors: Jun Tu, Xiamen (CN); Changzhi Wu, Xiamen (CN); Kangpeng Yang, Xiamen (CN); Yumin Xu, Xiamen (CN); Mingchao Hou, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 15/452,774

(22) Filed: Mar. 8, 2017

(65) Prior Publication Data

US 2017/0177158 A1 Jun. 22, 2017

(30) Foreign Application Priority Data

Oct. 31, 2016 (CN) .......................... 2016 1 0930711

(51) Int. Cl.
*G06F 3/041* (2006.01)
*G06F 3/044* (2006.01)
*G11C 19/00* (2006.01)
*G09G 3/20* (2006.01)

(52) U.S. Cl.
CPC ............ *G06F 3/0416* (2013.01); *G06F 3/044* (2013.01); *G06F 3/0412* (2013.01); *G09G 3/20* (2013.01); *G09G 2310/0286* (2013.01); *G11C 19/00* (2013.01)

(58) Field of Classification Search
CPC ................ G06F 3/0416; G06F 3/0412; G09G 2310/0283; G09G 3/20; G11C 19/00
See application file for complete search history.

(56) References Cited

U.S. PATENT DOCUMENTS

| 2010/0194697 | A1* | 8/2010 | Hotelling | G06F 3/0412 345/173 |
| 2015/0145822 | A1* | 5/2015 | Katsuta | G06F 3/044 345/174 |
| 2015/0370401 | A1* | 12/2015 | Mizuhashi | G02F 1/13338 345/174 |

* cited by examiner

*Primary Examiner* — Liliana Cerullo
(74) *Attorney, Agent, or Firm* — Anova Law Group, PLLC

(57) ABSTRACT

A touch control display panel and a touch control display device are provided. The touch control display panel comprises a shift register including a plurality of cascaded shift register units, wherein a scanning line is electrically connected to an output terminal of a shift register unit; a touch driving electrode array including a plurality of touch driving electrodes; a touch switching control circuit and a plurality of touch signal lines, wherein a touch signal line has one end electrically connected to a touch driving electrode and the other end electrically connected to an output terminal of the touch switching control circuit; and a touch signal control line cluster including a plurality of touch signal control lines, wherein a touch signal control line has one end electrically connected to the output terminal of the shift register unit, and the other end electrically connected to the touch switching control circuit.

19 Claims, 13 Drawing Sheets

TOUCH CONTROL DISPLAY PANEL AND TOUCH CONTROL DISPLAY DEVICE

CROSS-REFERENCES TO RELATED APPLICATIONS

This application claims priority of Chinese Patent Application No. 201610930711.8, filed on Oct. 31, 2016 the entire contents of which are hereby incorporated by reference.

FIELD OF THE INVENTION

The present disclosure generally relates to the field of display technology and, more specifically, relates to a touch control display panel and a touch control display device thereof.

BACKGROUND

Touch control display devices are able to detect the coordinates of the position on a touchscreen contacted by a finger, stylus, or other objects, and display corresponding information according to the detected coordinates. To realize a touch control function, a current touch control display panel often includes two touch control electrode layers, each of which includes a plurality of touch control electrodes arranged in parallel. The touch control electrodes in one touch control electrode layer intersect the touch control electrodes in the other touch control electrode layer. Capacitors are formed in intersections between the touch control electrodes in the two touch control electrode layers.

When a touch driving signal is applied to each touch control electrode (i.e., touch driving electrode) in one touch control electrode layer and the touchscreen is pressed or tapped by the finger, a capacitance change is introduced, and an electrical current is generated accordingly. Through detecting the electrical current, a touch sensing circuit identifies two perpendicular touch control electrodes where the capacitance changes and, thus, determines the point at which the touch occurs.

In general, an integrated circuit (IC) of the touch control display device sequentially applies touch driving signals to the touch driving electrodes. In an existing touch control display panel, to reduce the number of the output terminals for outputting the touch driving signals by the IC, a touch shift register circuit, which provides touch driving signals in sequence to the touch driving electrodes, is often disposed at the bottom of the touch control display panel. In other words, the IC may input the touch driving signal to the touch shift register circuit through one output terminal. Then the touch shift register circuit sequentially shifts the touch driving signal and output the shifted touch driving signal to the corresponding touch driving electrode.

However, the touch shift register circuit may include a substantially large number of components/elements, which occupy a substantially large space in the display panel and, accordingly, bring challenges to realize a narrow frame of the display panel.

The disclosed touch control display panel and touch control display device thereof are directed to solve one or more problems set forth above and other problems.

BRIEF SUMMARY OF THE DISCLOSURE

One aspect of the present disclosure provides a touch control display panel. The touch control display panel comprises a plurality of scanning lines; a plurality of data lines; a pixel array confined by the scanning lines and the data lines; a shift register including a plurality of cascaded shift register units; a touch driving electrode array including a plurality of touch driving electrodes; a touch switching control circuit and a plurality of touch signal lines; and a touch signal control line cluster including a plurality of touch signal control lines. The scanning lines are extending in a first direction. The data lines are extending in a second direction and intersecting the scanning lines. A scanning line is electrically connected to an output terminal of a shift register unit. A touch signal line has one end electrically connected to a touch driving electrode, and the other end electrically connected to an output terminal of the touch switching control circuit. A touch signal control line has one end electrically connected to the output terminal of the shift register unit, and the other end electrically connected to the touch switching control circuit. The touch switching control circuit is controlled by the touch signal control line to provide a touch driving signal to the touch signal line.

Another aspect of the present disclosure provides a touch control display device comprising a touch control display panel. The touch control display panel comprises a plurality of scanning lines; a plurality of data lines; a pixel array confined by the scanning lines and the data lines; a shift register including a plurality of cascaded shift register units; a touch driving electrode array including a plurality of touch driving electrodes; a touch switching control circuit and a plurality of touch signal lines; and a touch signal control line cluster including a plurality of touch signal control lines. The scanning lines are extending in a first direction. The data lines are extending in a second direction and intersecting the scanning lines. A scanning line is electrically connected to an output terminal of a shift register unit. A touch signal line has one end electrically connected to a touch driving electrode, and the other end electrically connected to an output terminal of the touch switching control circuit. A touch signal control line has one end electrically connected to the output terminal of the shift register unit, and the other end electrically connected to the touch switching control circuit. The touch switching control circuit is controlled by the touch signal control line to provide a touch driving signal to the touch signal line.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

The present disclosure provides an improved touch control display panel capable of reducing the number of the terminals for outputting the touch driving signals and simplifying the integrated circuit (IC), thereby narrowing the frame of the touch control display panel.

Figure 1:
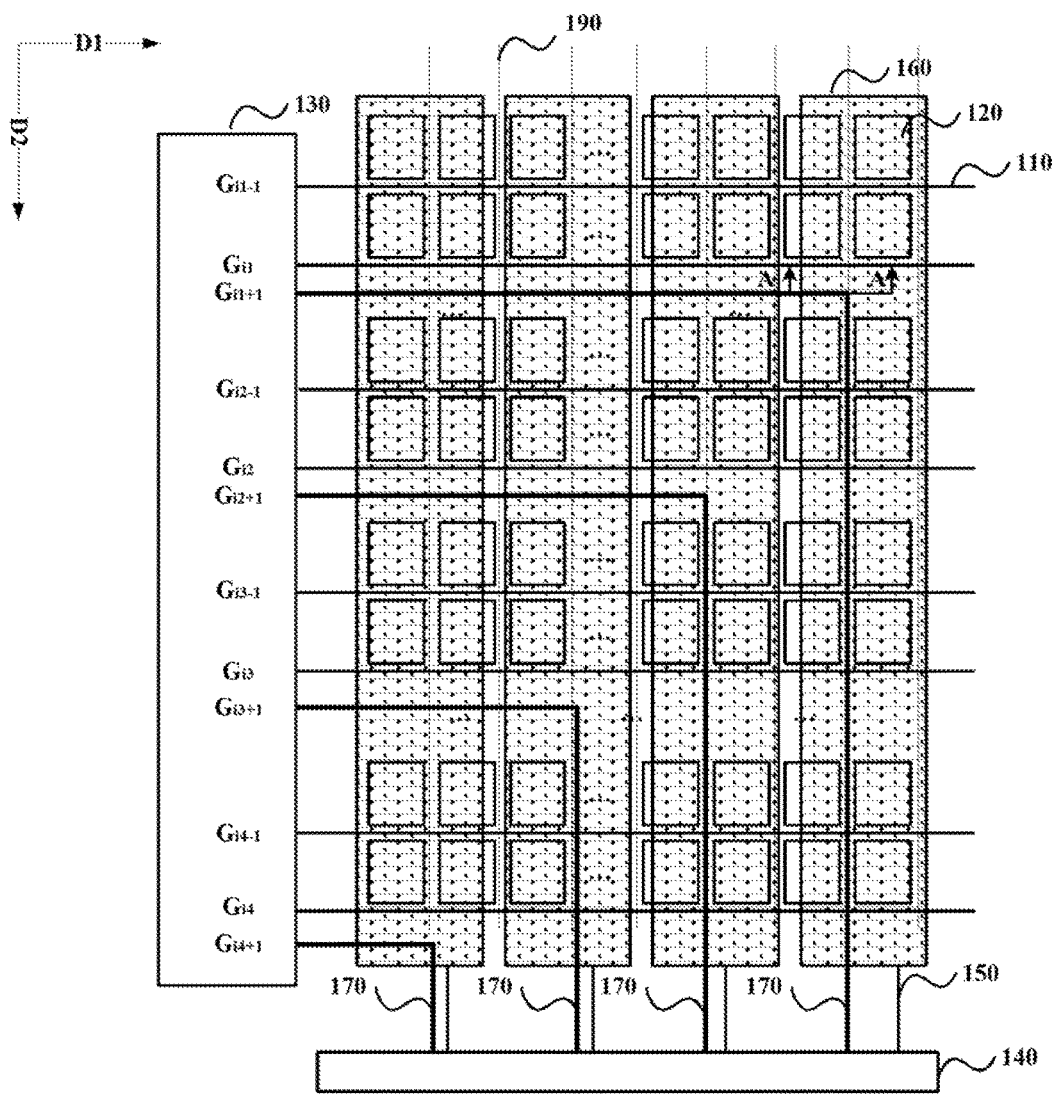
FIG. 1 illustrates a schematic diagram of an exemplary touch control display panel consistent with disclosed embodiments.

FIG. 1 illustrates a schematic diagram of an exemplary touch control display panel consistent with disclosed embodiments. The touch control display panel may be a liquid crystal display (LCD) touch control display panel, an organic light-emitting diode (OLED) touch control display panel, a plasma touch control display panel (PDP), a field emission touch control display (FED) panel, a light-emitting diode (LED) touch control display panel, a quantum dots (QDs) touch control display panel, an electrophoretic touch control display panel or other appropriate touch control display panel capable of displaying videos and/or images.

As shown in FIG. 1, the touch control display panel 1000 may include m number of scanning lines 110 and n number of data lines 190, where m and n are positive integers. The scanning lines 110 and the data lines 190 may extend along a first direction D1 and a second direction D2, respectively. Herein, the second direction D2 may intersect the first direction D1.

The scanning lines 110 may intersect the data lines 190 to confine a pixel array, which may include a plurality of display pixels 120 arranged in an array. The first direction D1 and the second direction D2 in FIG. 1 are for illustrative purposes and are not intended to limit the scope of the present disclosure. The touch control display panel 1000 may also include a shift register 130 including a plurality of cascaded shift register units. Each scanning line 110 may be electrically connected to an output terminal of a corresponding shift register unit.

The touch control display panel 1000 may also include a touch switching control circuit 140, a plurality of touch signal lines 150, and a touch driving electrode array including k number of touch driving electrodes 160. Each touch signal line 150 may have one end electrically connected to a corresponding touch driving electrode 160, and the other end electrically connected to an output terminal of the touch switching control circuit 140.

In addition, the control display panel 1000 may also include a touch signal control line cluster. The touch signal control line cluster may include a plurality of touch signal control lines. Each touch signal control line 170 may have one end electrically connected to an output terminal of a corresponding shift register unit, and the other end electrically connected to an output terminal of the touch switching control circuit 140. Controlled by the touch signal control lines 170, the touch switching control circuit 140 may provide a touch driving signal to each touch signal line 150.

One of touch signal control lines 170 may be electrically connected to an output terminal $G_{i1+1}$ of the (i1+1)-th stage shift register unit. That is, with the step-by-step output of the shift register 130, when the (i1+1)-th stage shift register unit outputs a signal, the touch signal control line 170 electrically connected to the output terminal of the (i1+1)-th stage shift register unit may control the touch switching control circuit 140 to output a touch diving signal to the touch signal line 150 controlled by the touch signal control line 170.

On the other hand, because the touch signal control lines 170, which control different touch signal lines 150, are connected to different shift register units in the shift register 130, two different touch driving electrodes 160 may not simultaneously receive the touch driving signal. Thus, a sequential scanning over each touch driving electrode 160 may be realized.

Thus, by sharing the shift register 130 between the scanning lines 110 and the touch signal control lines 170, an extra touch shift register circuit of more electrical elements, which is often disposed at the bottom of the existing touch control display panel, may be removed. Instead, the touch switching control circuit 140 including fewer electrical elements may be disposed in the touch control display panel, thereby simplifying the circuits in touch control display panels and realizing the sequential scanning over each touch driving electrode 160.

It should be noted that, FIG. 1 shows that the shift register 130 is disposed at one side of the touch control display panel 1000, which is for illustrative purposes and is not intended to limit the scope of the present disclosure. In practical applications, the shift register 130 inducing a plurality of shift register units may be disposed at different sides of the touch control display panel according to various application scenarios.

For example, in one embodiment, the shift register 130 inducing a plurality of shift register units may be disposed at one side of the touch control display panel. In another embodiment, some shift register units may be disposed at one side of the touch control display panel, and some shift register units may be disposed at another side of the touch control display panel. Thus, the number of the shift register units disposed at each side of the touch control display panel may be reduced and, accordingly, the size of the frame may be reduced. That is, a narrow frame of the touch control display panel may be realized.

In the disclosed embodiments, the touch control display panel 1000 may comprise a first conductive layer, a second conductive layer, and a first insulating layer. The first insulating layer may be formed between the first conductive layer and the second conductive layer. The scanning lines 110 may be formed on the first conductive layer, while the data lines 190 may be formed on the second conductive layer.

Figure 2:
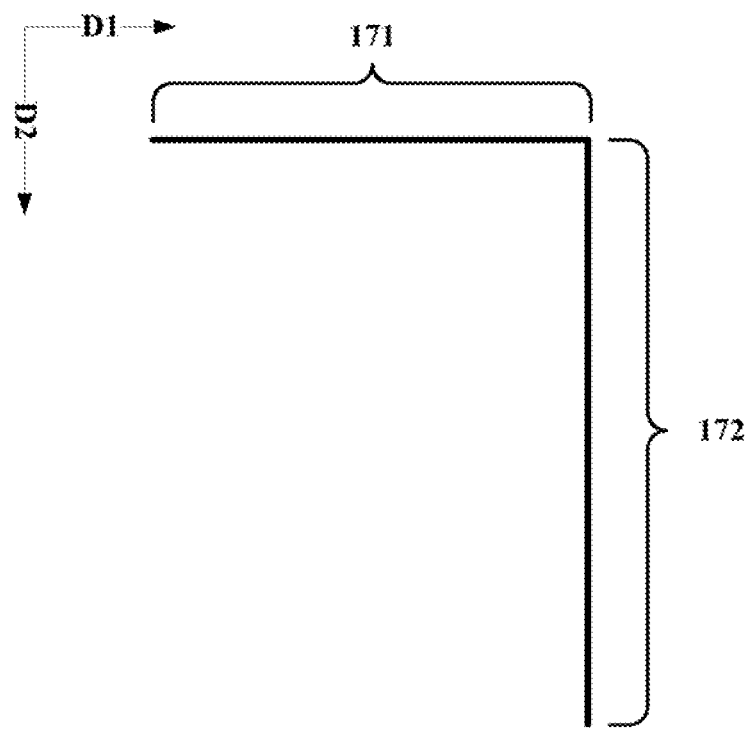
FIG. 2 illustrates a schematic diagram of an exemplary touch signal control line in an exemplary touch control display panel consistent with disclosed embodiments.

FIG. 2 illustrates a schematic diagram of an exemplary touch signal control line in an exemplary touch control display panel consistent with disclosed embodiments. As shown in FIG. 2, the touch signal control line 170 may include a first segment 171 and a second segment 172 extending in a first direction of D1 and a second direction of D2, respectively. The first direction D1 and the second direction D2 in FIG. 2 are for illustrative purposes and are not intended to limit the scope of the present disclosure.

Referring to FIG. 1 and FIG. 2, the first segment 171 of each touch signal control line 170 may have one end electrically connected to an output terminal of one shift register unit, and the other end electrically connected to one end of the second segment 172 of the touch signal control line 170. The other end of the second segment 172 may be electrically connected to the control terminal of the touch switching control circuit 140 Thus, a signal outputted from the output terminal of the shift register unit may be transmitted through the first segment 171 and the second segment 172 of the touch signal control line 170 to the touch switching control circuit 140, thereby controlling the touch switching control circuit 140 to output the touch driving signal to the corresponding touch signal line 150.

In one embodiment, the first segment 171 and the second segment 172 of the touch signal control line 170 may be formed in the first conductive layer and the second conductive layer, respectively. The first segment 171 of the touch signal control line 170 may be electrically connected to the second segment 172 of the same touch signal control line 170 via a through-hole formed in the first insulating layer.

That is, the first segment 171 of the touch signal control line 170 may be disposed at the same layer as the scanning line 110 of the touch control display panel 1000, while the second segment 172 of the touch signal control lines 170 may be disposed at the same layer as the data lines of the touch control display panel 1000. Accordingly, the touch signal control lines 170 may be disposed on the existing conductive layers of the touch control display panel 1000 without introducing extra conductive layers, thereby eliminating the possibility of increasing the thickness of the touch control display panel due to the introduction of the touch signal control lines 170. The corresponding structure is shown in FIG. 3A.

Figure 3A:
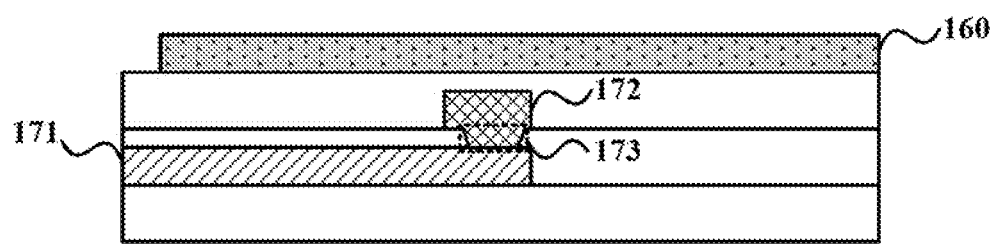
FIG. 3A illustrates an A-A' cross sectional view of an exemplary touch control display panel in FIG. 1 having an exemplary touch signal control line with a first segment and a second segment disposed in different conductive layers consistent with disclosed embodiments.

FIG. 3A illustrates an A-A' cross sectional view of an exemplary touch control display panel in FIG. 1 having an exemplary touch signal control line with a first segment and a second segment disposed in different conductive layers consistent with disclosed embodiments. Note that the data lines are not shown in FIG. 3A. The reference numeral 160 denotes a touch driving electrode.

As shown in FIG. 3A, the first segment 171 and the second segment 172 of the touch signal control line 170 may be formed on a first conductive layer and a second conductive layer, respectively. The first segment 171 and the second segment 172 may be electrically connected via a through-hole 173 in a first insulating layer, which is disposed between the first conductive layer and the second conductive layer.

In another embodiment, the touch control display panel may further include a third conductive layer and each touch signal control line may be formed in the third conductive layer. The corresponding structure is shown in FIG. 3B.

Figure 3B:
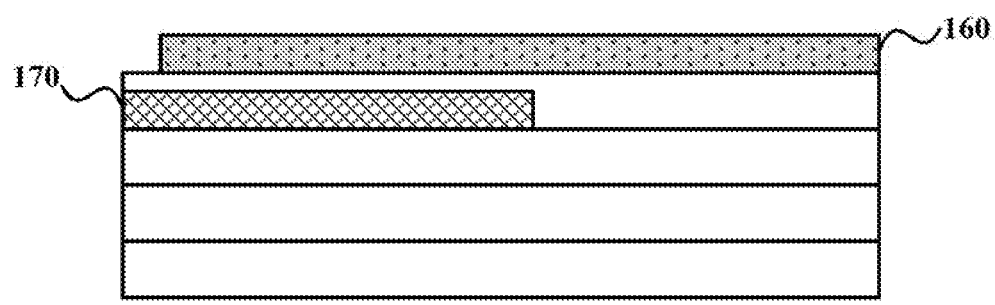
FIG. 3B illustrates an A-A' cross sectional view of an exemplary touch control display panel in FIG. 1 having an exemplary touch signal control line with a first segment and a second segment disposed in a same conductive layer consistent with disclosed embodiments.

FIG. 3B illustrates an A-A' cross sectional view of an exemplary touch control display panel in FIG. 1 having an exemplary touch signal control line with a first segment and a second segment disposed in a same conductive layer consistent with disclosed embodiments. Note that the data lines are not shown in FIG. 3B. The reference numeral 160 denotes a touch driving electrode.

As shown in FIG. 3B, the touch control display panel may further include a third conductive layer and each touch signal control line may be formed in the third conductive layer. That is, both the first segment and the second segment of the touch signal control line 170 may be formed in the same layer. Thus, an extra through-hole 173 as shown in FIG. 3A may not have to been formed in the first insulating layer, without increasing the complexity of the patterning process for fabricating the existing insulating layers.

In addition, by disposing both the first segment and the second segment of the touch signal control line 170 in the same third conductive layer, both the first segment and the second segment of the touch signal control line 170 may be formed in the same patterning process and, thus, open circuit or poor conductivity due to process deviation arising from the respective fabrication of the first segment and the second segment of the touch signal control line 170 may be prevented.

Figure 4:
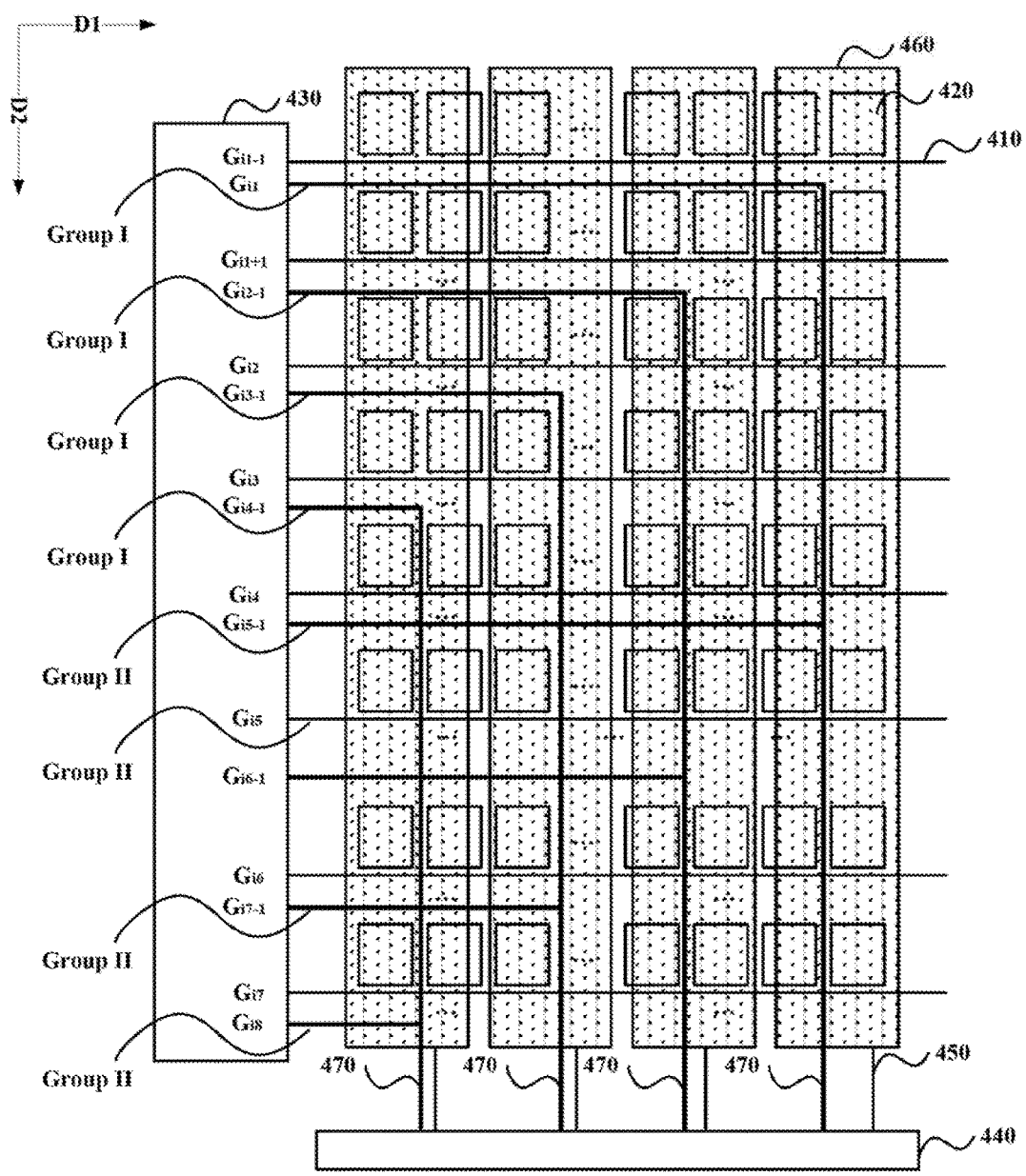
FIG. 4 illustrates a schematic diagram of another exemplary touch control display panel consistent with disclosed embodiments.

FIG. 4 illustrates a schematic diagram of another exemplary touch control display panel consistent with disclosed embodiments. The similarities between FIG. 1 and FIG. 4 are not repeated here, while certain differences may be explained.

As shown in FIG. 4, the touch control display panel 4000 may include m number of scanning lines 410 and n number of data lines (not shown in FIG. 4), extending in a first direction D1 and a second direction D2, respectively. The scanning lines 410 and the data lines may intersect to confine a pixel array, which may include a plurality of display pixels 420 arranged in an array. The touch control display panel 4000 may also include a shift register 430, which may include a plurality of cascaded shift register units. Each scanning line 410 may be electrically connected to an output terminal of a corresponding shift register unit.

The touch control display panel 4000 may also include a touch driving electrode array, a touch switching control circuit 440, and a plurality of touch signal lines 450. The touch driving electrode array may include k number of touch driving electrodes 460. Each touch signal line 450 may have one end electrically connected to one touch driving electrode 460, and the other end electrically connected to an output terminal of the touch switching control circuit 440.

In addition, the touch control display panel 4000 may also include a touch signal control line cluster. Different from the touch control display panel 1000 in FIG. 1, the touch signal control line cluster in FIG. 4 may include a plurality of touch signal control line groups, and each touch signal control line group may include k number of touch signal control lines 470 one-to-one corresponding to the k number of touch driving electrodes 460. Each touch signal control line 470 may have one end electrically connected to an output terminal of a corresponding shift register unit, and the other end electrically connected to the touch switching control circuit 440.

That is, each touch signal control line group may include k number of the touch signal control lines 470. Each touch signal control line group may include a touch signal control line 470 for controlling the same touch signal line 450.

In the touch control display panel 4000, the times of applying the driving signal to each touch driving electrode 460 in one frame period may be equal to the number of the touch signal control line groups included in the touch signal control line cluster. Thus, each touch driving electrode 460 may be scanned a plurality of times in one frame period and, thus, the times of touch detection may be increased and the sensitivity of touch detection may be improved, accordingly.

For example, in one embodiment, as shown in FIG. 4, the touch signal control line cluster may include two touch signal control line groups, group I and group II. Accordingly, each touch driving electrode 460 may be scanned twice in one frame period. Compared to the touch control display 1000 in FIG. 1, in the touch control display panel 4000 in FIG. 4, the times of touch detection may be increased to twice of the times of touch detection in the touch control display panel 1000 in FIG. 1 and, accordingly, the touch detection sensitivity of the touch control display panel 4000 may be twice as high as the touch detection sensitivity of the touch control display panel 1000 in FIG. 1.

In addition, in one embodiment, the two touch signal control lines 470 corresponding to the same touch driving electrode 460 may be electrically connected to an output terminal of the i-th stage shift register unit and an output terminal of the j-th stage shift register unit, respectively, where i and j are natural numbers, and |i−j|≥m/2. Herein, m may be the number of scanning lines 410 disposed on the touch control display panel 4000, i.e., the number of pixel rows in the pixel array, and the two touch signal control lines 470 may be disposed in the two touch signal control line groups (i.e., group I and group II), respectively.

Accordingly, for each touch driving electrode 460, the two scans performed on the touch driving electrode 460 in one frame period may be located in a first half and a second half of the frame period, respectively. Thus, for each driving electrode 460, the scanning period may be uniformly configured in one frame period, thereby reducing the interference between the touch scanning and the displaying.

Figure 5:
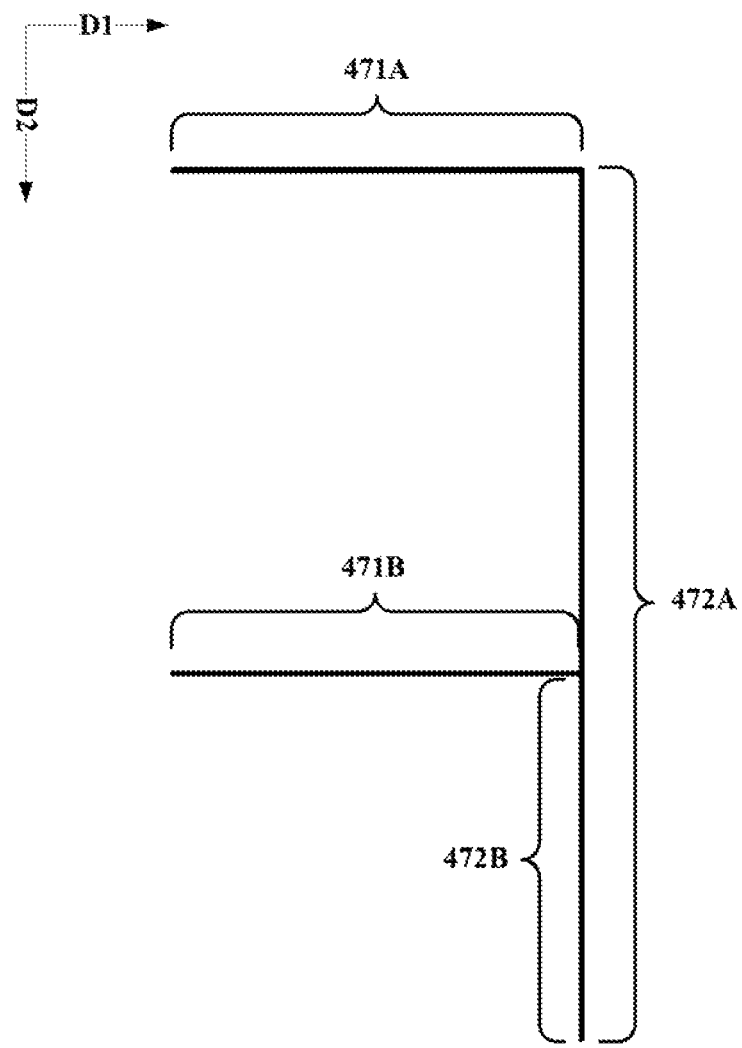
FIG. 5 illustrates a schematic diagram of an exemplary touch signal control line corresponding to an exemplary touch driving electrode consistent with disclosed embodiments in FIG. 4.

FIG. 5 illustrates a schematic diagram of an exemplary touch signal control line corresponding to an exemplary touch driving electrode consistent with disclosed embodiments in FIG. 4. The similarities between FIG. 2 and FIG. 5 are not repeated here, while certain differences may be explained.

As shown in FIG. 5, 471A and 472A denote a first segment and a second segment of one touch signal control line, respectively, and 471B and 472B denote a first segment and a second segment of another touch signal control line, respectively The two touch signal control lines in FIG. 5 may be configured to control the same touch driving electrode 460.

The second segment 472A of one touch signal control line and the second segment 472B of another touch signal control line may at least partially overlap with each other. Thus, the patterning process for fabricating each touch signal control line may be simplified, and the yield of fabricating the touch signal control line may be improved.

Figure 6A:
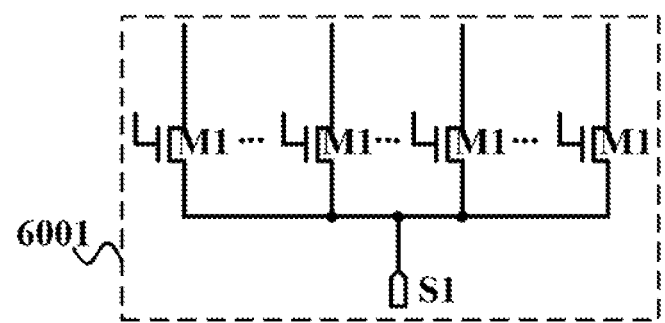
FIG. 6A illustrates an equivalent circuit diagram of an exemplary touch switching control circuit consistent with disclosed embodiments.

FIG. 6A illustrates an equivalent circuit diagram of an exemplary touch control switching circuit consistent with disclosed embodiments. As shown in FIG. 6A, the touch display panel may further include a touch driving signal terminal S1 and the touch switching control circuit 6001 may include a plurality of first transistors M1. The first transistor M1 may include a gate electrode, a first electrode, and a second electrode.

The gate electrode of the first transistor M1 may be electrically connected to one of the touch signal control lines in each touch signal control line cluster, the first electrode of the first transistor M1 may be electrically connected to the touch signal line, and the second electrode of the first transistor M1 may be electrically connected to the touch driving signal terminal S1.

Accordingly, when a shift register unit, which is electrically connected to a touch signal control line 670, outputs the signal, the first transistor M1 controlled by the touch signal control line in the touch switching control circuit 6001 may be turned on, and the touch driving signal outputted by the touch driving signal terminal S1 may be provided to the corresponding touch driving electrode.

Figure 6B:
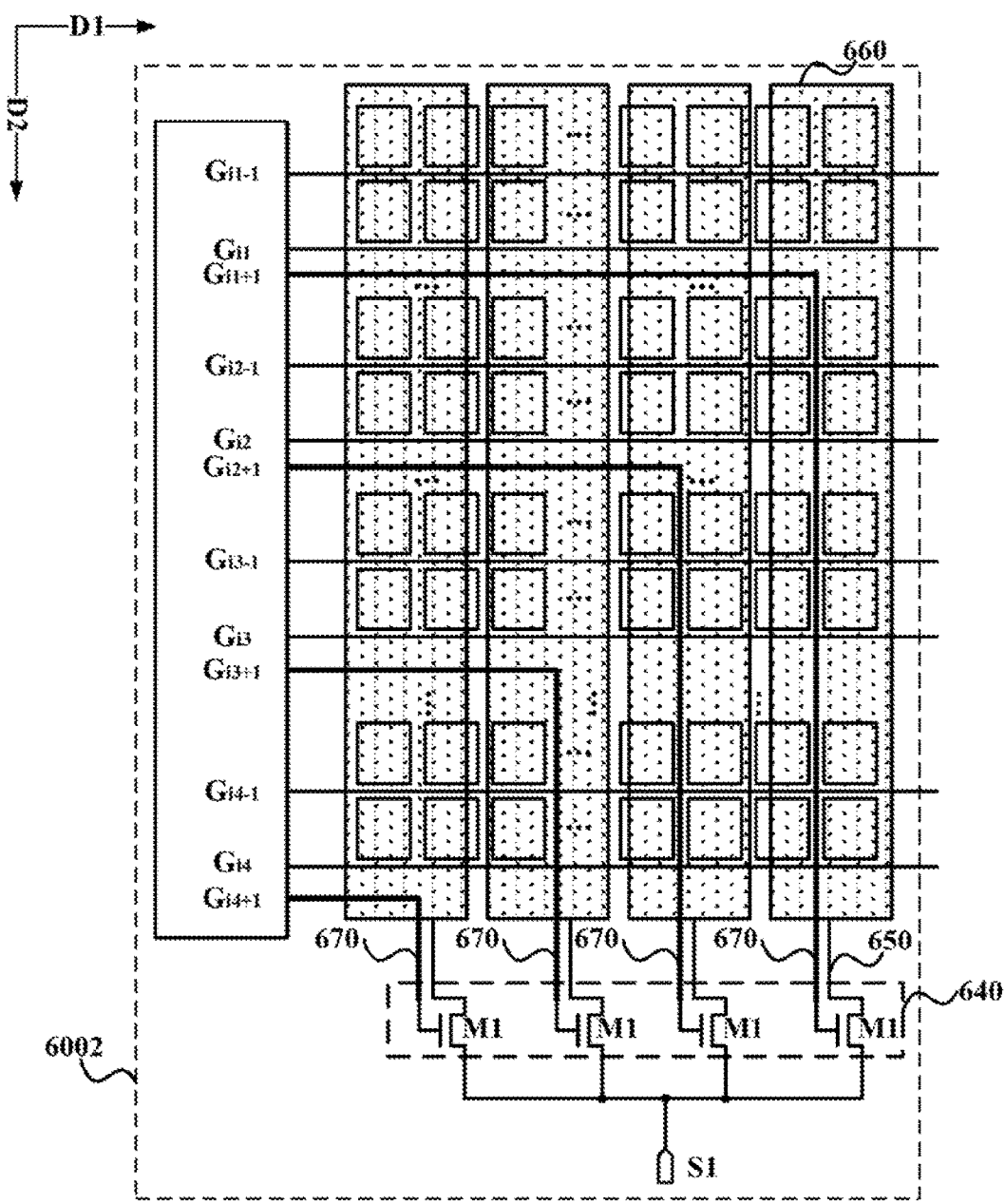
FIG. 6B illustrates a schematic diagram of an exemplary touch control display panel having an exemplary touch switching control circuit in FIG. 6A consistent with disclosed embodiments.

FIG. 6B illustrates a schematic diagram of an exemplary touch control display panel having an exemplary touch control switching circuit in FIG. 6A consistent with disclosed embodiments.

As shown in FIG. 6B, the gate electrode of each first transistor M1 may be electrically connected to one of the touch signal control lines 670 in each touch signal control line cluster, the first electrode of each first transistor M1 may be electrically connected to the corresponding touch signal line 650, and the second electrode of each first transistor M1 may be electrically connected to the touch driving signal terminal S1.

When the shift register unit, which is electrically connected to the touch signal control line 670, outputs a signal, the first transistors M1 electrically connected to the touch signal control line 670 may be turned on, such that the touch driving signal supplied by the touch driving signal terminal S1 may be provide to the corresponding touch driving electrode 660.

Figure 7A:
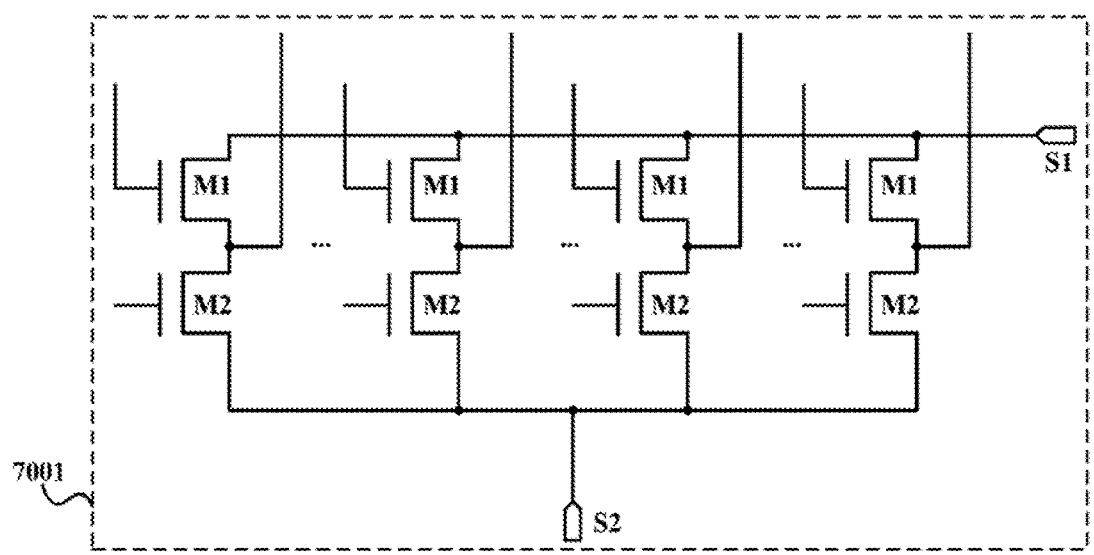
FIG. 7A illustrates an equivalent circuit diagram of another exemplary touch switching control circuit consistent with disclosed embodiments.

FIG. 7A illustrates an equivalent circuit diagram of another exemplary touch control switching circuit consistent with disclosed embodiments. The similarities between FIG. 6A and FIG. 7A are not repeated here, while certain differences may be explained.

As shown in FIG. 7A, the touch switching control circuit 7001 may also include a plurality of the first transistors M1, which may be connected in the same manner as the first transistors M1 in the touch switching control circuit 6001 in FIG. 6A.

Different from the touch switching control circuit 6001 in FIG. 6A, the touch switching control circuit 7001 may further include a plurality of second transistors M2, and each second transistor M2 may also comprise a gate electrode, a first electrode, and a second electrode. In addition to the touch driving signal terminal S1, the touch control display panel applied with the touch switching control circuit 7001 may further include a plurality of display switching control signal terminals (not drawn in FIG. 7A) and a common voltage signal terminal S2.

Controlled by the signals from each display switching control signal terminal, the touch switching control circuit 7001 may also provide the common voltage signal, supplied by the common voltage signal terminal S2, to each touch signal.

The gate electrode of each second transistor M2 may be electrically connected to the display switching control signal terminal, the first electrode of each second transistor M2 may be electrically connected to the common voltage signal terminal S2, and the second electrode of each second transistor M2 may be electrically connected to the first electrode of the corresponding first transistor M1.

When the first transistor M1 is turned on, the touch driving signal supplied from the touch driving signal terminal S1 may be outputted to the touch driving electrode, which is electrically connected to the first transistor M1. On the other hand, when the second transistor M2 is turned on, the common voltage signal supplied from the common voltage signal terminal S2 may be outputted through the second transistor M2 to the touch driving electrode, which is electrically connected to the second transistor M2.

Figure 7B:
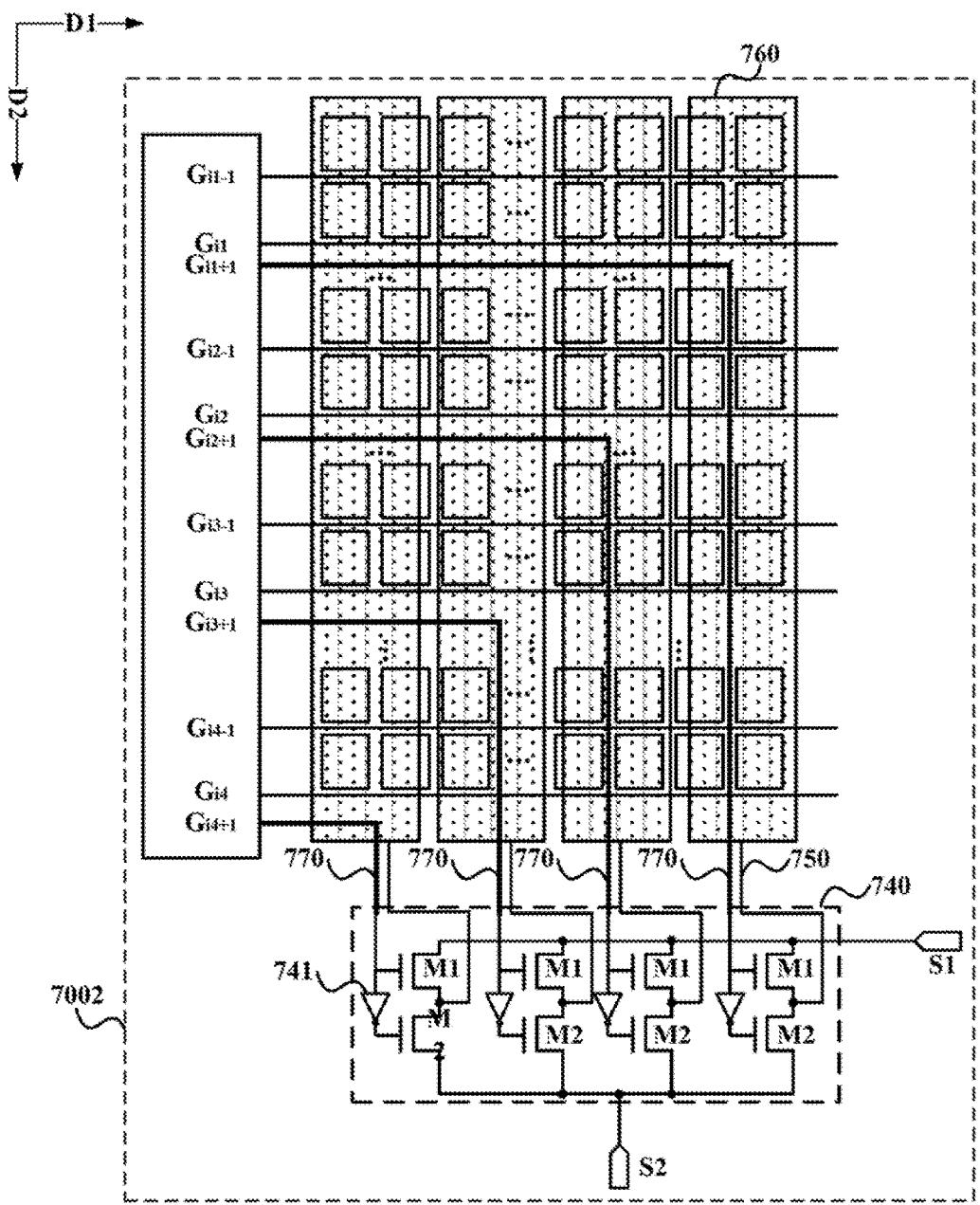
FIG. 7B illustrates a schematic diagram of an exemplary touch control display panel having an exemplary touch switching control circuit in FIG. 7A consistent with disclosed embodiments.

FIG. 7B illustrates a schematic diagram of an exemplary touch control display panel having an exemplary touch control switching circuit in FIG. 7A consistent with disclosed embodiments. The similarities between FIG. 6B and FIG. 7B are not repeated here, while certain differences may be explained.

As shown in FIG. 7B, in the touch control display panel 7002, each touch driving electrode 760 may also be multiplexed as a common electrode. That is, during the touch detection stage, the touch signal control line 770 may control the first transistors M1 to be turned on, through which the touch driving electrode 760 may receive the touch driving signal outputted by the touch driving signal terminal S1. On the other hand, during the display stage, each of the second transistors M2 may be turned on, through which each touch driving electrode 760 may receive the common voltage signal outputted from the common voltage signal terminal S2.

That is, in the touch switching control circuit of the touch control display panel 7002, the first transistor M1 and the second transistor M2, which are electrically connected to the same touch driving electrode 760, may not be turned on at the same time.

In one embodiment, as shown in FIG. 7B, when the first transistor M1 and the second transistor M2 are both NMOS transistors or both PMOS transistors, an inverter 741 may be connected between the gate electrode of the first transistor M1 and the gate electrode of the corresponding second transistor M2 electrically connected to the same touch driving electrode 760. The input terminal and the output terminal of the inverter 741 may be connected to the gate electrode of the first transistor M1 and the gate electrode of the second transistor M2, respectively. Thus, the first transistor M1 and the second transistor M2 which are electrically connected to the same touch driving electrode 760 may be not turned on at the same time.

In another embodiment, when one of the first transistor M1 and the second transistor M2 is an NMOS transistor and the other is a PMOS transistor, the gate electrodes of the first transistor M1 and the second transistor M2, which are electrically connected to the same touch driving electrode 760, may be electrically connected directly. Thus, the first electrode M1 and the second electrode M2 which are electrically connected to the same touch driving electrode 760 may be not simultaneously turned on.

Figure 8:
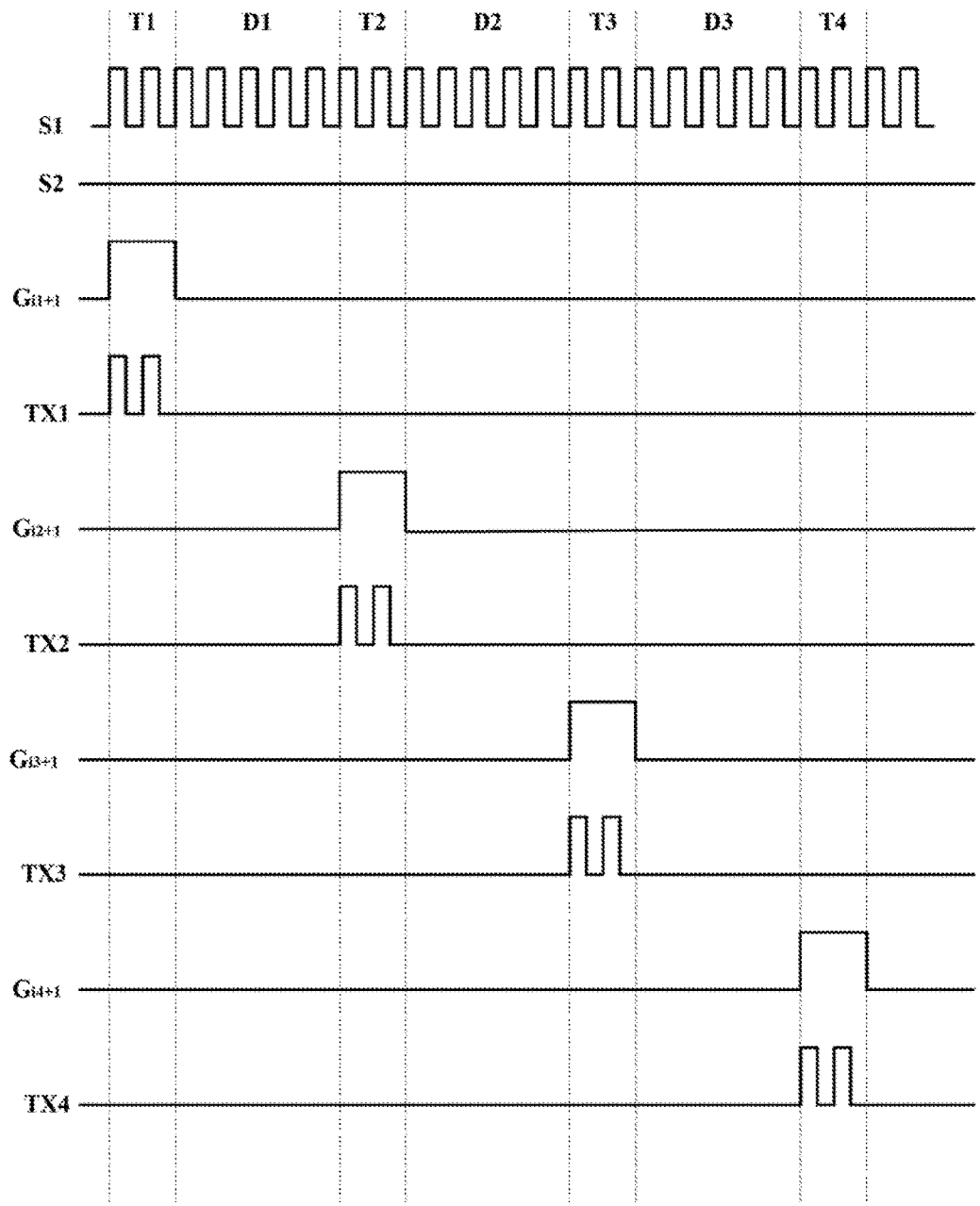
FIG. 8 illustrates an exemplary timing diagram for driving an exemplary touch control display panel in FIG. 7B consistent with disclosed embodiments.

FIG. 8 illustrates an exemplary timing diagram for driving an exemplary touch control display panel in FIG. 7B consistent with disclosed embodiments. As shown in FIG. 8, during the first touch detection stage (i.e., T1) of the frame period, a high level signal may be received by a touch signal control line 770 which is electrically connected to the output terminal $G_{i1+1}$ of the (i1+1)-th stage shift register unit of the shift register. Thus, the first transistor M1 electrically connected to the touch signal control line 770 may be turned on and, accordingly, the touch driving signal outputted from the touch driving signal terminal S1 may be outputted to the corresponding touch driving electrode via the corresponding touch signal line 750.

During the time period in which the output terminal $G_{i1+1}$ of the (i1+1)-th stage shift register unit outputs a low level signal, the touch signal control line 770 which is electrically connected to the output terminal $G_{i1+1}$ of the (i1+1)-th stage shift register unit may receive the low level signal. Thus, the second transistor M2 electrically connected to the touch signal control line 770 may be turned on and, accordingly, a common voltage signal outputted from the common voltage signal terminal S2 may be provided to the corresponding touch driving electrode 760.

Similarly, during the second to the fourth touch detection stages (i.e., T2 to T4) of the frame period, a high level signal may be received by the corresponding touch signal control lines 770 which are electrically connected to the corresponding output terminals, $G_{i2+1}$ to $G_{i4+1}$, of the (i2+1)-th stage to the (i4+1)-th stage shift register units, respectively. Thus, the first transistor M1 respectively electrically connected to the corresponding touch signal control line 770 may be turned on and, accordingly, the touch driving signal outputted from the touch driving signal terminal S1 may be transmitted to the corresponding touch driving electrode 760 via the associated touch signal line 750.

When the output terminals, $G_{i2+1}$ to $G_{i4+1}$, of the (i2+1)-th stage to the (i4+1)-th stage shift register units respectively output a low level signal, the low level signal may be received by the corresponding touch signal control lines 770 which are electrically connected to the corresponding output terminals, $G_{i2+1}$ to $G_{i4+1}$, of the (i2+1)-th stage to the (i4+1)-th stage shift register units. Thus, the second transistor M2 electrically connected to the corresponding touch signal control line 770 may be turned on and, accordingly, the common voltage signal outputted from the common voltage signal terminal S2 may be provided to the corresponding touch driving electrode 760.

Thus, through sharing the shift register between the scanning lines and the touch signal control lines 770, an extra touch shift register circuit of more electrical elements may be removed from the bottom frame of touch control display panel. Instead, a touch switching control circuit of fewer electrical elements may be disposed in the touch control display panels to realize the sequential scanning over each touch driving electrode, thereby narrowing the frame at each side of touch control display panel.

Figure 9:
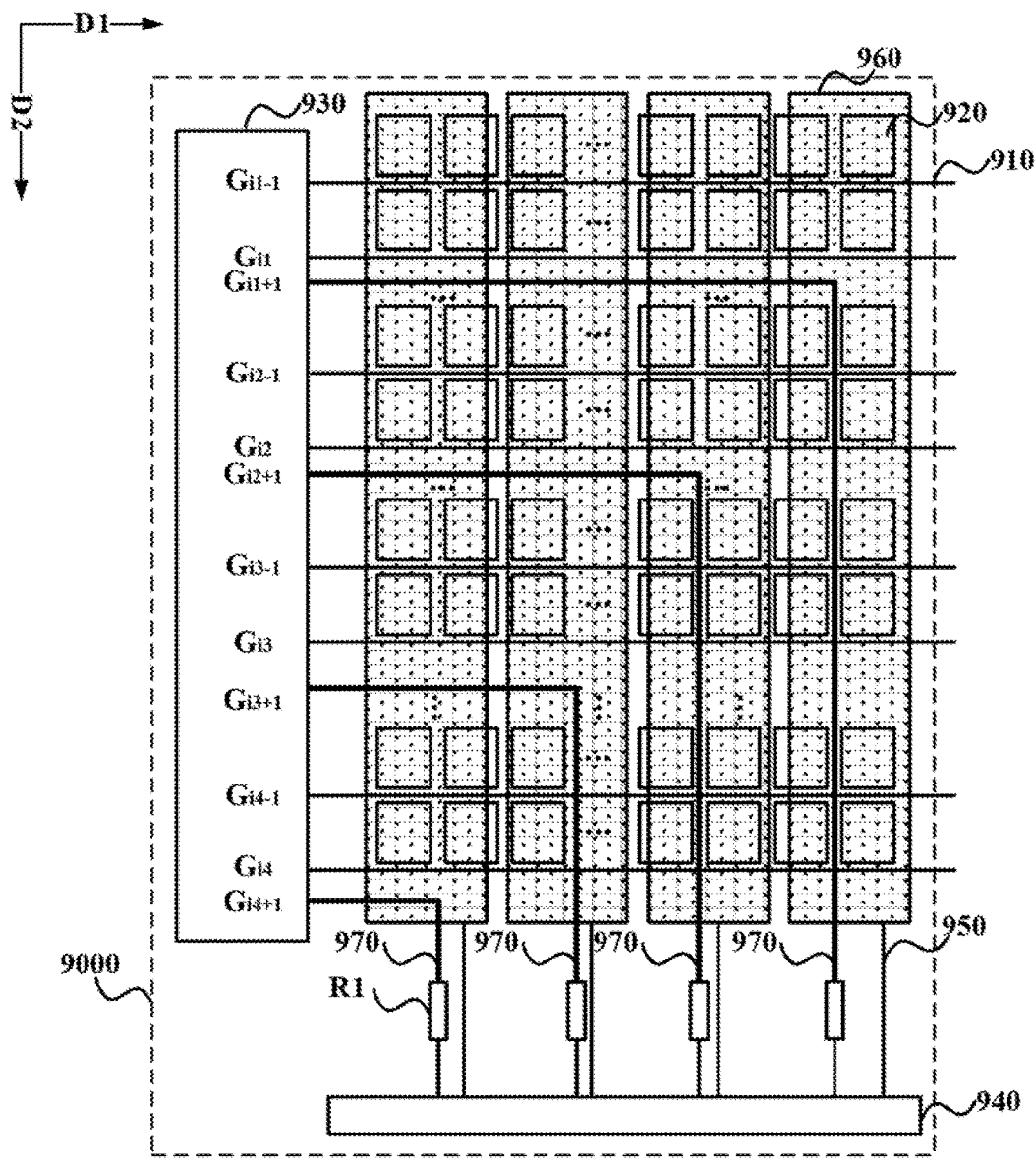
FIG. 9 illustrates a schematic diagram of another exemplary touch control display panel consistent with disclosed embodiments.

FIG. 9 illustrates a schematic diagram of another exemplary touch control display panel consistent with disclosed embodiments. The similarities between FIG. 1 and FIG. 9 are not repeated here, while certain differences may be explained.

As shown in FIG. 9, the touch control display panel 9000 may include m number of scanning lines 910 and n number of data lines (not shown in FIG. 9) extending in a first direction D1 and a second direction D2, respectively. Herein, the second direction D2 may intersect the first direction D1 to confine a pixel array, which may include a plurality of pixels 920 arranged in an array.

The touch control display panel 9000 may also include a shift register 930, which may include a plurality of cascaded shift register units. Each of the scanning lines 910 may be connected to an output terminal of a corresponding shift register unit.

The touch control display panel 9000 may also include a touch driving electrode array including k number of the touch driving electrodes 960, a touch switching control circuit 940, and a plurality of touch signal lines 950. One end of each touch signal line 950 may be electrically connected to one of touch driving electrodes 960, while the other end of each touch signal line 950 may be electrically connected to an output terminal of the touch switching control circuit 940.

In addition, the touch control display panel 9000 may further include a touch signal control line cluster, which may include a plurality of touch signal control lines 970. One end of each touch signal control line 970 may be electrically connected to an output terminal of a corresponding shift register unit, while the other end of each touch signal control line 970 may be electrically connected to an output terminal of the touch switching control circuit 940. The touch switching control circuit 940 may be controlled by each touch signal control line 970 to provide the touch driving signal to each touch signal line 950.

Different from the touch control display panel 1000 in FIG. 1, the touch control display panel 9000 in FIG. 9 may further include a plurality of resistors R1. Each resistor R1 may be connected between an output terminal of a corresponding shift register unit electrically connected to one touch signal control line 970 and the touch switching control circuit 940. Thus, the signals outputted to the touch switching control circuit 940 via each touch signal control line 970 may have the same magnitude of amplitude.

In the touch control display panel 9000, through disposing a plurality of resistors R1 with variable resistance values between the output terminals of the shift register units and the touch switching control circuit 940, the resistance difference among different touch signal control lines 970 with various lengths may be eliminated.

For example, in one embodiment, a resistor R1 with smaller resistance may be provided to a longer touch signal control line 970, while a resistor R1 with larger resistance may be provided to a shorter touch signal control line 970. Thus, the control signals passing through different touch signal control lines 970 into the touch switching control circuit 940 may have the same magnitude of amplitude.

In addition, it should be noted that FIG. 9 illustrates each resistor R1 is disposed between the touch signal control line 970 and the touch switching control circuit 940, which is for illustrative purposes and is not intended to limit the scope of the present disclosure. In practice applications, the resistor R1 may be positioned at various places in the touch control display panel 9000 according to various application scenarios, as long as the resistance of resistor R1 may be varied to enable the input signals into the touch switching control circuit 940 to have the same magnitude of amplitude. For example, in one embodiment, the resistor R1 may be disposed at the output terminal of the shift register unit which is electrically connected to the corresponding touch signal control line 970.

Further, the touch control display panel may include a display area and a non-display area surrounding the display area. The non-display area may include a first frame region, and a second frame region connecting the first frame region.

The shift register and the touch switching control circuit may be formed in the first frame region and the second frame region, respectively.

For example, in one embodiment, the first frame region may be the left-side frame or the right-side frame of the touch control display panel, and the second frame region may be the bottom-side frame of the touch control display panel.

Figure 10:
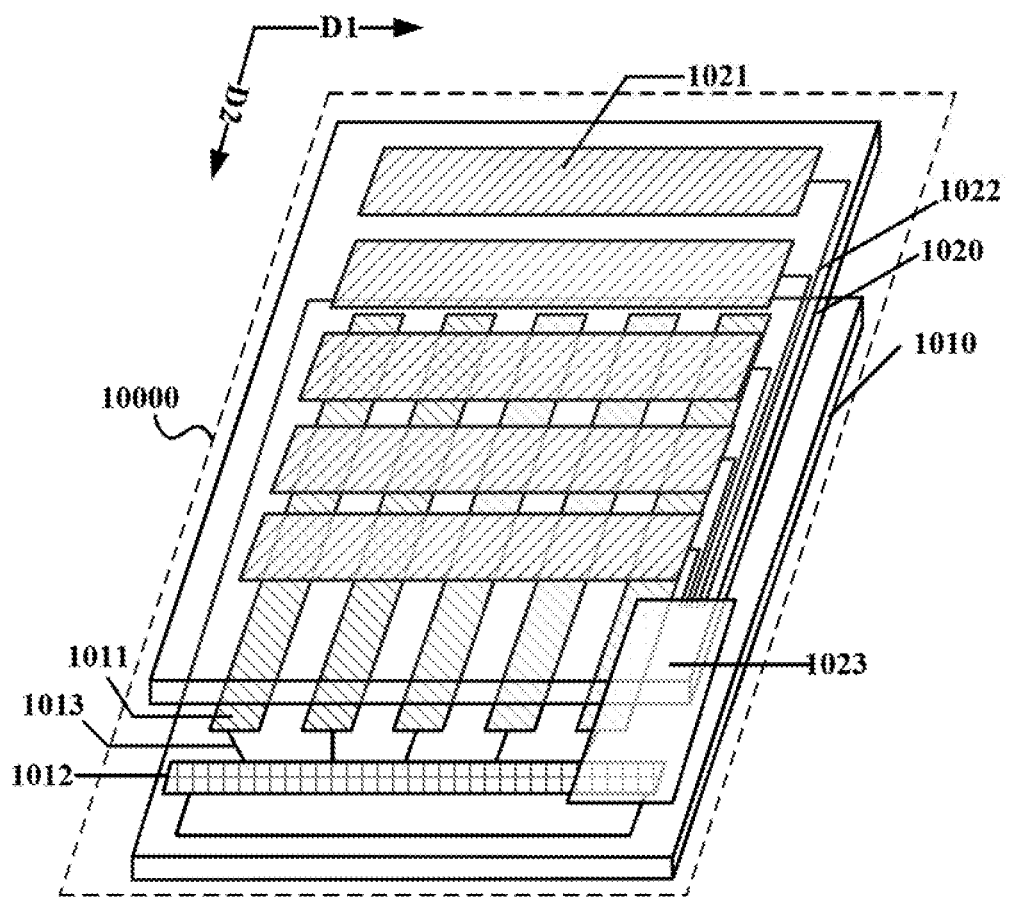
FIG. 10 illustrates an exemplary touch control display panel consistent with disclosed embodiments.

FIG. 10 illustrates an exemplary touch control display panel consistent with disclosed embodiments. As shown in FIG. 10, the touch control display panel 10000 may include an array substrate 1010 and a color film substrate 1020 disposed opposite to the array substrate 1010. A plurality of touch driving electrodes 1011 arranged in an array may be disposed on the array substrate 1010. A plurality of touch sensing electrodes 1021 arranged in an array may be disposed on the color film substrate 1020.

The touch driving electrode 1011 may be a striped electrode extending in the direction of D2, and the touch sensing electrode 1021 may also be a striped electrode extending in the direction of D1. The orthogonal projection of each touch sensing electrode 1021 onto the array of touch driving electrodes 1011 may partially overlap with the respective touch driving electrode 1011. The shape of the touch driving electrode 1011 and the touch sensing electrode 1021 is for illustrative purposes and is not intended to limit the scope of the present disclosure.

In one embodiment, the touch sensing electrode array may be disposed on the surface of the color film substrate 1020 far away from the array substrate 1010. For example, as shown in FIG. 10, the touch sensing electrode array may be disposed on the top surface of the color film substrate 1020. Meanwhile, the touch driving electrode array may be disposed on the surface of the array substrate 1010 facing towards the color film substrate 1020.

The touch control display panel 10000 may further include an integrated circuit 1012, a plurality of touch signal lines 1013, and a plurality of touch sensing signal lines 1022.

Each touch signal line 1013 may have one end connected to the corresponding touch driving electrode 1011, and the other end connected to the integrated circuit 1012. Similarly, each touch sensing signal line 1022 may have one end connected to the corresponding touch sensing electrode 1021, and the other end connected to the integrated circuit 1012.

Because the touch sensing signal lines 1022 are disposed on the color film substrate 1020 while the integrated circuit 1012 is disposed on a different substrate, i.e., on the array substrate 1010, to form a conductive pathway between the touch sensing signal lines 1022 and the integrated circuit 1012, for example, a flexible printed circuit board may be adopted to connect the touch sensing signal lines 1022 and the integrated circuit 1012.

In the touch stage, the integrated circuit 1012 may provide the touch scan signal to each touch driving electrode 1011 and, meanwhile, receive the touch sensing signal from each touch sensing electrode 1021. For example, in one embodiment, the integrated circuit 1012 in the touch stage may provide the touch scan signals in sequence to each touch driving electrode 1011 and, meanwhile, may receive the touch sensing signals from all the touch sensing electrodes 1021. The touch position may be determined by distinguishing the difference in the touch sensing signals transmitted by the touch sensing electrodes 1021.

In one embodiment, in the touch control display panel, each touch driving electrode 1011 may be multiplexed as a common electrode in the display stage. The integrated circuit 1012 may further provide a common voltage signal to each touch driving electrode 1011 in the display stage. Thus, when a liquid crystal layer (not shown in FIG. 10) is disposed between the array substrate 1010 and the color film substrate 1020, the liquid crystal molecules in the liquid crystal layer may be rotated under the electric field formed between the common electrodes (i.e., the touch driving electrodes 1011) and the pixel electrodes, thereby displaying predetermined images.

In addition, the touch control display panel 10000 may also include a plurality of touch signal control lines (not shown in FIG. 10) and a touch switching control circuit (not shown in FIG. 10). The operating principles of the touch signal control lines and the touch switching control circuit have been described in detail and are not be repeated here.

Figure 11:
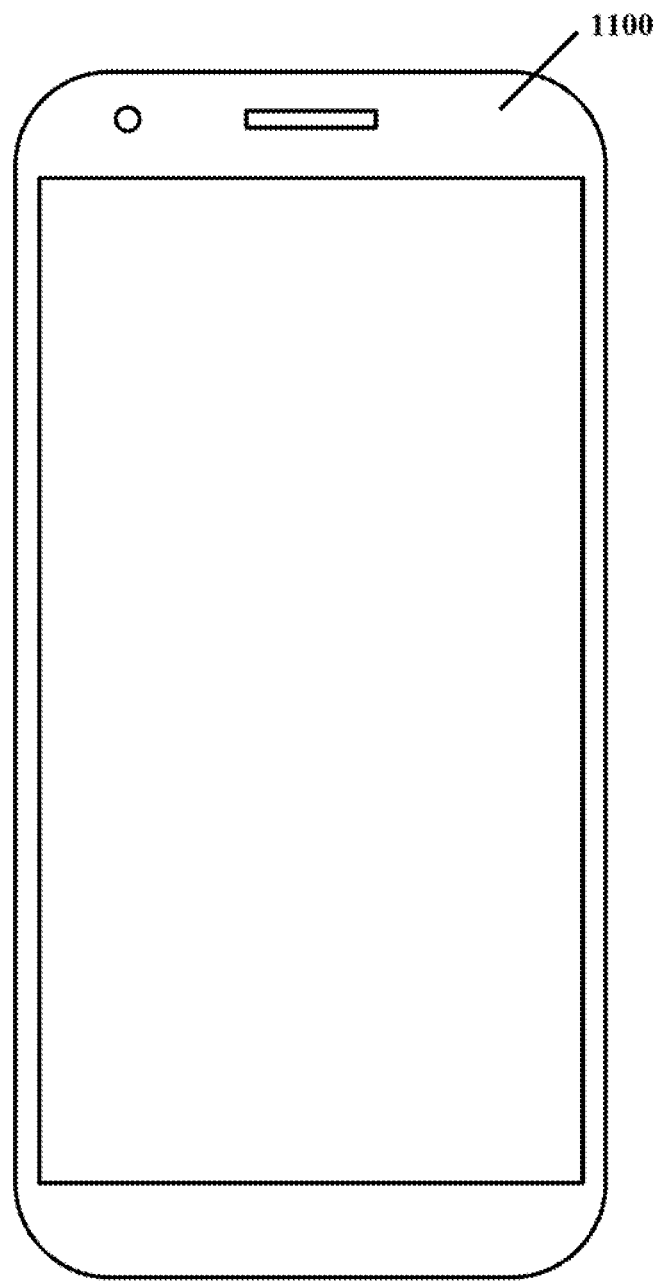
FIG. 11 illustrates an exemplary touch control display device consistent with disclosed embodiments.

FIG. 11 illustrates an exemplary touch control display device consistent with disclosed embodiments. As shown in FIG. 11, the touch control display device 1100 may include any one of the disclosed touch control display panels. In addition to the disclosed touch control display panel, the touch control display device 1100 may also include other appropriate structures, which are not be described here.

Because the touch control display device 1100 includes the disclosed touch control display panel, the touch control display device 1100 may also exhibit the same advantages as the disclosed touch control display panel. Further, the touch control display device 1100 may be a cellular mobile phone 1100, a tablet computer, a computer monitor, a monitor applied into a smart wearable device, a display device installed in a vehicle or a transportation facility, etc. Although a smart phone is shown in FIG. 11, the touch control display device 1100 is not limited to the smart phone.

In the disclosed embodiments, the touch display panel may include a touch switching control circuit and a touch signal control line cluster. The touch switching control circuit may be configured to control each touch signal control line in the touch signal control line cluster, and provide a touch driving signal to each touch signal control line. Thus, the size of bottom frame (or lower frame) of the touch control display panel may be reduced, which is in line with the trend of narrow frame of the touch control display panel.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A touch control display panel, comprising:
    a plurality of scanning lines extending in a first direction;
    a plurality of data lines extending in a second direction and intersecting the scanning lines;
    a pixel array confined by the scanning lines and the data lines;
    a shift register including a plurality of cascaded shift register units, wherein a scanning line is electrically connected to an output terminal of a shift register unit;
    a touch driving electrode array including a plurality of touch driving electrodes;
    a touch switching control circuit and a plurality of touch signal lines, wherein a touch signal line has one end electrically connected to a touch driving electrode and the other end electrically connected to an output terminal of the touch switching control circuit; and
    a touch signal control line cluster including a plurality of touch signal control lines, wherein a touch signal control line has one end electrically connected to the output terminal of the shift register unit, and the other end electrically connected to the touch switching control circuit,
    wherein the touch switching control circuit is controlled by the touch signal control line to provide a touch driving signal to the touch signal line, and
    the output terminal of the shift register unit is electrically connected to both the scanning line and the one end of the touch signal control line.

2. The touch control display panel according to claim 1, further including:
    a first conductive layer;
    a second conductive layer; and
    a first insulating layer formed between the first conductive layer and the second conductive layer,
    wherein the scanning lines and the data lines are formed in the first conductive layer and the second conductive layer, respectively,
    the touch signal control line includes a first segment extending in the first direction and a second segment extending in the second direction, and
    the first segment of the touch signal control lines has one end electrically connected to the output terminal of the shift register unit, and the other end electrically connected to one end of the second segment of the same touch signal control line, and the second segment of the same touch signal control line has the other end electrically connected to a control terminal of the touch switching control circuit.

3. The touch control display panel according to claim 2, wherein:
    the first segment and the second segment of the touch signal control line are formed in the first conductive layer and the second conductive layer, respectively; and
    the first segment of the touch signal control line is electrically connected to the second segment of the same touch signal control line via a through-hole formed in the first insulating layer.

4. The touch control display panel according to claim 2, further including:
    a third conductive layer, wherein the touch signal control lines are formed in the third conductive layer.

5. The touch control display panel according to claim 2, wherein:
    the touch signal control line cluster includes a plurality of touch signal control line groups; and
    a touch signal control line group includes a plurality of touch signal control lines one-to-one corresponding to the plurality of the touch driving electrodes.

6. The touch control display panel according to claim 5, wherein:
    the touch control display panel includes m number of scanning lines;
    the touch signal control line cluster includes two touch signal control line groups; and
    two touch signal control lines, corresponding to the same touch driving electrode, are electrically connected to the output terminal of the i-th shift register unit and the output terminal of the j-th stage shift register unit, respectively, where the two touch signal control lines are disposed in the two touch signal control line groups, respectively, m is a positive integer, i and j are natural numbers, and |i−j|≥m/2.

7. The touch control display panel according to claim 5, wherein:
the second segments of the touch signal control lines, corresponding to the same touch driving electrode, are at least partially overlapped with each other.

8. The touch control display panel according to claim 1, further including:
a touch driving signal terminal,
wherein the touch switching control circuit includes a plurality of first transistors,
a first transistor has a gate electrode electrically connected to one touch signal control line in each touch signal control line cluster, a first electrode electrically connected to the touch signal line, and a second electrode electrically connected to the touch driving signal terminal.

9. The touch control display panel according to claim 8, further including:
a common voltage signal terminal; and
a display switching control signal terminal,
wherein controlled by a signal from the display switching control signal terminal, the touch switching control circuit provides a common voltage signal supplied from the common voltage signal terminal to the touch signal line,
the touch switching control circuit further includes a plurality of second transistors, and
a second transistor has a gate electrode electrically connected to the display switch control signal terminal, a first electrode electrically connected to the common voltage signal terminal, and a second electrode electrically connected to the first electrode of the first transistor.

10. The touch control display panel according to claim 9, wherein:
a frame period includes a touch detection stage and a display stage;
during the touch detection stage, the touch signal control line control the first transistor to be turned on, such that each touch driving electrode receives the signal transmitted from the corresponding touch signal control line; and
during the display stage, each second transistor is turned on, such that each touch driving electrode receives the common voltage signal,
wherein the first transistor and the second transistor, electrically connected to the same touch driving electrode, are not simultaneously turned on.

11. The touch control display panel according to claim 8, further including:
a plurality of resistors,
wherein a resistor is connected between the output terminal of the shift register unit electrically connected to the touch signal control line and the touch switching control circuit, such that the signal outputted from each touch signal control line into the touch switching control circuit have a same magnitude of amplitude.

12. The touch control display panel according to claim 8, further including:
a display area and a non-display area,
wherein the non-display area is surrounding the display area;
the non-display area includes a first frame region, and a second frame region connecting to the first frame region; and
the shift register and the touch switching control circuit are formed in the first frame region and the second frame region, respectively.

13. The touch control display panel according to claim 12, further including:
a touch sensing electrode array including a plurality of touch sensing electrodes,
wherein an orthogonal projection of a touch sensing electrode onto the touch driving electrode array partially overlaps with respective touch driving electrode.

14. The touch control display panel according to claim 13, wherein:
the touch driving electrode is a striped electrode extending in the second direction; and
the touch sensing electrode is a striped electrode extending in the first direction.

15. A touch control display device, comprising:
a touch control display panel,
wherein the touch control display panel comprises:
a plurality of scanning lines extending in a first direction;
a plurality of data lines extending in a second direction and intersecting the scanning lines;
a pixel array confined by the scanning lines and the data lines;
a shift register including a plurality of cascaded shift register units, wherein a scanning line is electrically connected to an output terminal of a shift register unit;
a touch driving electrode array including a plurality of touch driving electrodes;
a touch switching control circuit and a plurality of touch signal lines, wherein a touch signal line has one end electrically connected to a touch driving electrode and the other end electrically connected to an output terminal of the touch switching control circuit; and
a touch signal control line cluster including a plurality of touch signal control lines, wherein a touch signal control line has one end electrically connected to the output terminal of the shift register unit, and the other end electrically connected to the touch switching control circuit,
wherein the touch switching control circuit is controlled by the touch signal control line to provide a touch driving signal to the touch signal line, and
the output terminal of the shift register unit is electrically connected to both the scanning line and the one end of the touch signal control line.

16. The touch control display device according to claim 15, further including:
a first conductive layer;
a second conductive layer; and
a first insulating layer formed between the first conductive layer and the second conductive layer,
wherein the scanning lines and the data lines are formed in the first conductive layer and the second conductive layer, respectively,
the touch signal control line includes a first segment extending in the first direction and a second segment extending in the second direction, and
the first segment of the touch signal control lines has one end electrically connected to the output terminal of the shift register unit, and the other end electrically connected to one end of the second segment of the same touch signal control line, and the second segment of the same touch signal control line has the other end electrically connected to a control terminal of the touch switching control circuit.

17. The touch control display device according to claim 16, wherein:
the first segment and the second segment of the touch signal control line are formed in the first conductive layer and the second conductive layer, respectively; and
the first segment of the touch signal control line is electrically connected to the second segment of the same touch signal control line via a through-hole formed in the first insulating layer.

18. The touch control display device according to claim 16, wherein:
the touch signal control line cluster includes a plurality of touch signal control line groups; and
a touch signal control line group includes a plurality of touch signal control lines one-to-one corresponding to the plurality of the touch driving electrodes.

19. The touch control display device according to claim 18, wherein:
the touch control display panel includes m number of scanning lines;
the touch signal control line cluster includes two touch signal control line groups; and
two touch signal control lines, corresponding to the same touch driving electrode, are electrically connected to the output terminal of the i-th shift register unit and the output terminal of the j-th stage shift register unit, respectively,
where the two touch signal control lines are disposed in the two touch signal control line groups, respectively, m is a positive integer, i and j are natural numbers, and $|i-j| \geq m/2$.

* * * * *